United States Patent [19]
Kawaguchi et al.

[11] Patent Number: 6,114,744
[45] Date of Patent: Sep. 5, 2000

[54] SEMICONDUCTOR INTEGRATION DEVICE AND FABRICATION METHOD OF THE SAME

[75] Inventors: Masayuki Kawaguchi; Yasunari Tagami; Hirotsugu Hata, all of Gunma; Akira Hatsugai, Ashikaga, all of Japan

[73] Assignee: Sanyo Electric Company, Moriguchi, Japan

[21] Appl. No.: 09/038,885

[22] Filed: Mar. 12, 1998

[30] Foreign Application Priority Data

Mar. 14, 1997 [JP] Japan ..................................... 9-061098
Apr. 23, 1997 [JP] Japan ..................................... 9-106369

[51] Int. Cl.[7] ............................................. H01L 29/732
[52] U.S. Cl. ........................................... 257/587; 257/773
[58] Field of Search ................................... 257/587, 586, 257/773, 776, 750

[56] References Cited

U.S. PATENT DOCUMENTS

| | | |
|---|---|---|
| 4,753,709 | 6/1988 | Welch et al. ............................. 257/587 |
| 4,762,801 | 8/1988 | Kapoor . |
| 5,109,262 | 4/1992 | Kadota et al. ........................... 257/587 |
| 5,324,983 | 6/1994 | Onai et al. .............................. 257/587 |
| 5,350,948 | 9/1994 | Maehara ................................. 257/587 |
| 5,420,053 | 5/1995 | Miyazaki . |
| 5,479,047 | 12/1995 | Liao et al. .............................. 257/587 |
| 5,504,018 | 4/1996 | Sato ....................................... 257/587 |
| 5,622,887 | 4/1997 | Miwa et al. . |
| 5,714,415 | 2/1998 | Oguro . |
| 5,759,887 | 6/1998 | Ito et al. . |
| 5,798,561 | 8/1998 | Sato ....................................... 257/587 |
| 5,904,508 | 5/1999 | Codama et al. . |
| 5,955,775 | 9/1999 | Miwa ..................................... 257/587 |

*Primary Examiner*—David Hardy
*Attorney, Agent, or Firm*—Cantor Colburn LLP

[57] ABSTRACT

A lead electrode is formed to expose an active base region. A lead electrode for an emitter electrode is formed on the lead electrode in an emitter region, through an insulating film. The insulating film on the lead electrode is then etched to form a contact hole. After that, the emitter contact hole is formed to expose the lead electrode. Also, a silicon nitride film SN is interposed between the lead electrode and insulating film and between the lead electrode and LOCOS oxide film each to decrease resistance of the lead electrodes.

9 Claims, 21 Drawing Sheets

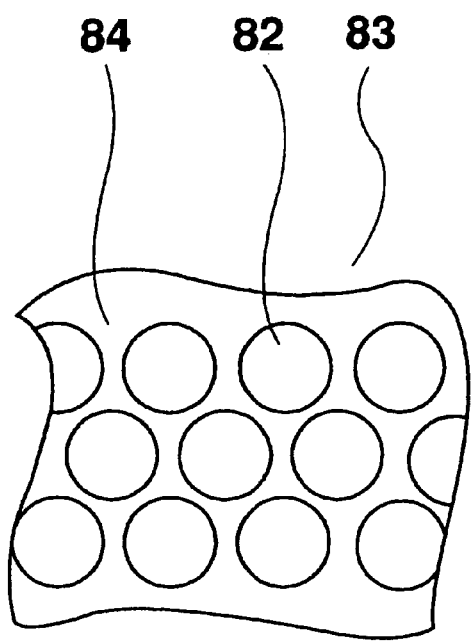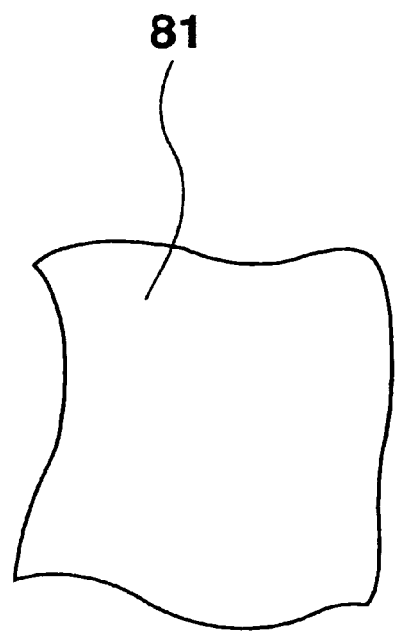
Fig. 9A  Fig. 9B

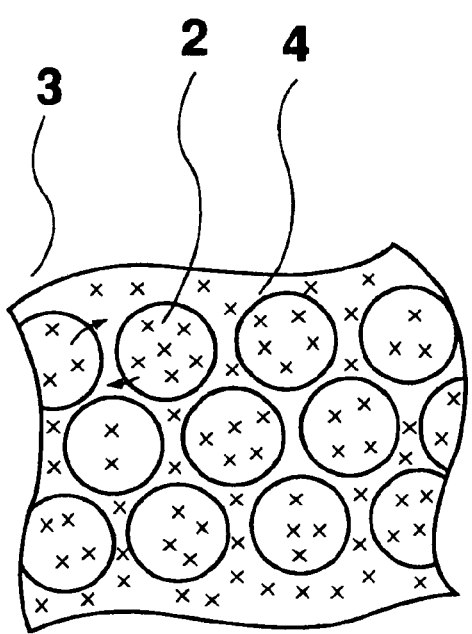 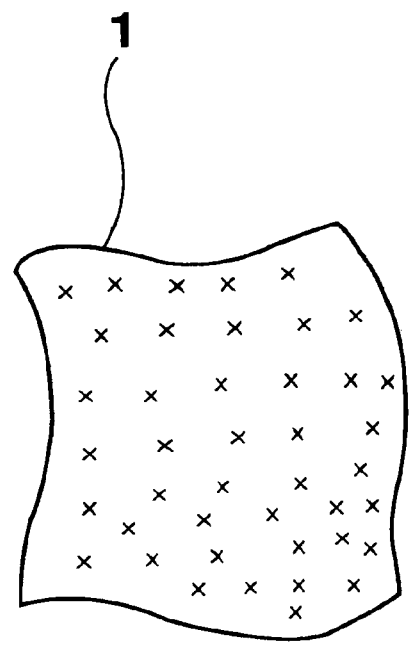
Fig. 11A   Fig. 11B

SEMICONDUCTOR INTEGRATION DEVICE AND FABRICATION METHOD OF THE SAME

BACKGROUND OF THE INVENTION

1. Field of the Invention

The present invention relates to a semiconductor integration device having improved transistor characteristics and to a fabrication method of the same.

2. Description of the Prior Art

Techniques have been proposed for obtaining a very small base-emitter junction. For example, such a technique is disclosed in Japanese Patent Laid-Open Publication No. Hei 7-235547 and Japanese Patent No. 2576373. The following describe the technique shown in the former publication by reference to the accompanying drawings, FIGS. 1A through 1G.

First, as shown in FIG. 1A, an n-type semiconductor layer 11 to become a collector is formed on a p-type semiconductor substrate using an epitaxial growth method. A surface of the semiconductor layer 11 is selectively oxidized to form a LOCOS oxidized film 12 for separating elements. There is an n+-type buried layer 13. At a bottom of the LOCOS layer 12 a p+-type separating region is formed for making a pn junction and separation of the n-type epitaxial layer.

A CVD oxidized film is deposited on the entire surface. Photo-etching is carried out to leave an insulation film 15 on the semiconductor layer to be emitter-diffused.

In turn, as shown in FIG. 1B, a surface of the semiconductor layer 11 not covered by the insulation film 15 has a polysilicon layer formed thereon by the selective epitaxial growth method to form a first silicon layer 16. After that, boron is ion-doped with impurities for external base diffusion into the first silicon layer 16. Further, a silicon layer is deposited on the whole surface by the LPCVD method to form a second silicon layer 17.

Boron is then ion-injected to make the second silicon layer 17 conductive. The second silicon layer 17 is photo-etched to make the first and second silicon layers 16 and 17 form a base lead electrode 18. At the same time, the insulation film 15 is made open thereon to expose a top of the insulation film 15 (see FIG. 1C).

Next, as shown in FIG. 1D, the insulation film 15 is removed to form an opening 19 to expose the surface of the semiconductor layer 11. After that, as shown in FIG. 1E, the entire device is heat-oxidized to form a heat oxidized film 20 on the surface of the semiconductor layer 11 and surfaces of the first and second silicon layers 16 and 17. At the same time, the impurities doped from the first silicon layer 16 are diffused to form an external base region 21. Further, boron for forming an active base region is ion-injected without using a mask.

Next, as shown in FIG. 1F, a polysilicon layer is deposited on the entire surface. The layer is anisotropically dry-etched to form a side wall 22 on a side wall of an opening 19. After that, an HTO (high temperature oxide) 23 is formed on the entire surface. Further, the HTO is etch-backed to again expose the surface of the semiconductor layer 11 at the opening 19.

Finally, as shown in FIG. 1G, a polysilicon layer is deposited by the CVD method. The impurities for emitter diffusion are doped, and after that the polysilicon layer is photo-etched to form an emitter lead electrode 24 at the opening 19. The entire substrate is heat-treated to diffuse the previously doped ions to form an active base region 25. At the same time, an emitter region 26 is formed by way of solid-phase diffusion from the emitter lead electrode 24.

An insulation layer is further adhered to the entire surface to form an emitter contact and base contact and form an emitter electrode and base electrode through a contact hole.

Using the method described above, a high-frequency transistor with very small size can be fabricated.

FIG. 2 shows structures of the first silicon layer 16 and base lead electrode 18 of FIGS. 1B to 1D integrated of polysilicon. Additionally a semiconductor integrated circuit device shown in FIG. 2 is formed in the process described above.

In the semiconductor integrated circuit device, after the step of forming the emitter lead electrode 24 (FIG. 1G), insulation film 27 is adhered to the whole surface as in the prior art described above to form an emitter contact 28, a base contact 29, and a collector contact 32 and also to form an emitter electrode 30, a base electrode 31, and a collector electrode 33.

However there is a problem that the base resistance of the transistor is increased, because the resistive base lead electrode 18 contacting to external base region 21 extends to the region above the LOCOS layer 12.

As shown in FIG. 3, the lead electrode 24 on the emitter region 26 is etched, and then a recess 34 is formed on the lead electrode 24. As the diffusion source is removed, it becomes difficult to make the diffusion of the impurities uniform. This causes a problem of differing depths of the emitter region 26.

The problem is present in the art described by reference to FIGS. 1A to 1G and the art in FIG. 2, and is described below by reference to FIG. 2.

As shown in FIG. 2, the insulation film 27 spread in the region in which the emitter contact 28, the base contact 29, and the collector contact 32 are formed, differs in film thickness depending on position.

That is, an area of the emitter contact 28 is covered with the insulation film 27, an area of the base contact 29 is covered with the HTO film along with the insulation film 27, and an area of the collector contact 32 is covered with the heat oxidized film 20 along with the insulation film 27. When the collector contact 32 and the base contact 29 are fully opened, the emitter lead electrode 24 is etched, forming a recess 34 on the electrode 24 because the film thickness of the area of emitter contact 28 is thinner than that of the areas of the base and collector contact 29 and 32.

When a recess 34 is formed on top of the emitter region 26, impurities to be doped into the emitter are removed by the etching and the diffusion depth of the emitter diffusion region 26 becomes different. This makes it impossible to obtain a desired $h_{FE}$ and causes dispersion.

FIGS. 4A through 4F depict cross-sectional views illustrating the technique disclosed in the latter publication. The following describes this prior art by reference to the figures.

A p-type semiconductor substrate 101, as shown in FIG. 4A, has an n-type epitaxial layer 102 provided thereon. There is provided an n+-type buried layer 103 therebetween. There are also provided an insulating separation layer 104 at each of end of the semiconductor substrate 101. The insulation separation layer 104 may be a layer formed in a trench as shown in the figure, or a LOCOS layer. A PN separating region further may be formed under the LOCOS layer.

The semiconductor substrate 101 further has a p+-type polysilicon film 105 and a silicon oxide film 106 formed on a whole surface thereof.

As shown in FIG. 4B, a patterning process is made by dry etching of the polysilicon film 105 and the silicon oxide film 106. The patterned polysilicon film 105 serves as a diffusion source for an external base region 107 and also as a lead electrode 108 for the external base region 107. The patterning causes an intended active base region 109, where impurities are not yet diffused, to be exposed.

A succeeding heating process diffuses impurities in the lead electrode 108 to form the external base region 107. The active base region 109 is formed by using an opening 111 that exposes the region to be the active base region 109. A silicon oxide film 110, as shown in FIG. 4C, is formed on the whole surface, and a spacer 112 is made by etching back the film 110 as shown in FIG. 4D.

114 of an emitter region is formed through an opening 113 formed at the inside of the spacer 112, and serves as a diffusion source and electrode. Therefore, the emitter region is formed by the deffusion(see FIG. 4F).

Finally, after a covering insulating film 115 is formed on the whole surface, a base electrode 118 and an emitter electrode 119 are respectively formed in a base contact 116 and an emitter contact. One end of the lead electrode 108 of the external base region exposed to the base contact 116 and one end of the lead electrode 114 of the emitter region is exposed to the emitter contact 116(see FIG. 4F).

The fabrication method described above also can make a fine high-frequency transistor.

However, referring to FIG. 4F, the prior art has a problem that over-etching is carried out on the lead electrode 114 of the emitter region, because the thickness of the insulating film positioned at the emitter contact 117 is different from that of the insulating films at the base contact 116.

In particular, the prior art has the problem that, if the lead electrode 114 is used as the diffusion source to form the emitter region, the impurities at the over-etched portion are reduced. This results in a diffusion depth at the emitter being made shallow only at that portion, causing irregularity of the diffusion depth. Further, use of the polysilicon film 105, as shown in FIG. 4B, causes the problem that a surface of the portion to be the active base region is made irregular.

The silicon oxide film 106 is a CVD oxide film and its lower film 105 is the polysilicon film. The polysilicon film 105 is an aggregate of grains and grain boundaries. The grain boundaries have higher etching rate than the grains. For this reason, dry etching causes the grains to remain on the surface of the active base region. This results in the active base region corresponding to the grain boundaries being etched to make the exposed surface of the silicon substrate irregular.

Further, there is also a problem that the contact resistance at the active base region is increased because this region finally becomes a contact part of the emitter electrode 114.

In addition, the irregular surface of the semiconductor layer causes various crystal surfaces to be exposed. For example, although the main surface is [1, 0, 0], the irregular surface has [1, 1, 1]. Since the [1, 1, 1] surface is high in diffusion speed, the shape of the emitter region is made irregular, in addition to the active base region having an irregular surface. Accordingly, together with the above-described problem with over-etching and the problem caused by using the polysilicon film, there is a problem that there a large dispersion of the transistor characteristics

SUMMARY OF THE INVENTION

An object of the present invention is to provide a semiconductor integrated device with improved transistor characteristics and a fabrication method of the same.

The present invention has a first insulating film having a silicon nitride film formed thereon. The silicon nitride film has a lead electrode of an external base region consisting of silicon film formed thereon.

The silicon film is effected by an under layer, and in particular, the silicon nitride film is used as the under layer and has the silicon film provided as a lead electrode for the external base region. This can decrease resistance of the film.

The lead electrode of the emitter region as a diffusion source is extended to the outside of an opening for exposing the emitter region, preferably onto a LOCOS oxidized film. An emitter contact is formed at the outside of the opening. For this reason, the insulating film positioned at a base contact is thick and the emitter lead electrode is etched before the contact holes can be fully opened. Even so, as formation of a recess of the emitter contact is shifted, no difference is caused in the diffusion depth in the emitter region.

On the other hand, as the emitter contact is shifted over the LOCOS oxidized film, resistance of the lead electrode of the emitter region is increased. As with the first means, however, the underlying film of silicon nitride film is provided to decrease the resistance of the lead electrode.

Also, with respect to the structure of the base contact hole of the transistor, by providing a base contact consisting of a insulating film for exposing the lead electrode of the active base region in the exposure part enclosed by the second insulating film, the lead electrode of the emitter region can be prevented from being over-etched.

Also, with respect to the structure of the base contact hole of the transistor, a base contact is formed as a hole of a third insulating film. The base contact formed by the third insulating film is in the first exposure part enclosed by the second insulating film. Then, the surface of the collector contact region can be prevented from being over-etched. The first exposure part exposes one end of the lead electrode of the active base region.

The third insulating film has a two-layered structure having a lower non-doped silicon glass film and an upper silicon glass film, with impurities being doped therein. The doped silicon glass film is caused to sagged by heat. This sagging is used to reduce a difference in contact height. The non-doped silicon glass film is provided to prevent the impurities in the doped film from entering the transistor region.

The lead electrode of the base region is formed of a-Si or single crystal silicon to solve the problem. Since the amorphous silicon (hereinafter referred to as a-Si) and single crystal silicon have no grain and grain boundary, the surface having no irregularity can be accomplished even when it is etched.

BRIEF DESCRIPTION OF THE DRAWINGS

FIGS. 9A and 9B are a view illustrating states of amorphous silicon film of the present invention and a prior polysilicon film.

FIGS. 11A and 11B are a view illustrating states of the amorphous silicon film of the present invention and the prior polysilicon film, when annealed.

DETAILED DESCRIPTION OF THE PREFERRED EMBODIMENT

Figure 5:
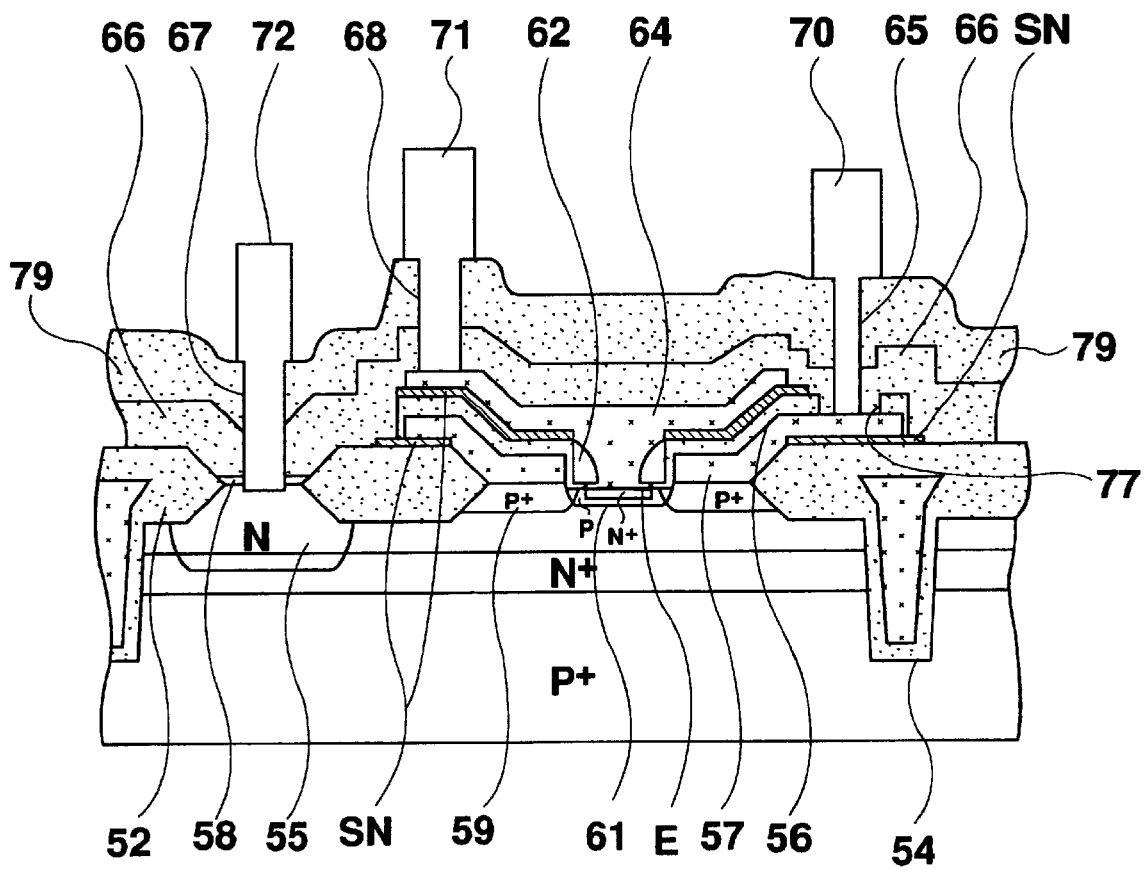
FIG. 5 is a cross-sectional view illustrating a semiconductor integration device in accordance with an embodiment of the present invention.

The following describes an embodiment of the present invention by reference to the accompanying drawings. Referring to FIG. 5, the construction is described briefly below. A LOCOS film 52 is formed to make a collector contact region 55 and a base region exposed, the base region being made of an active base region 61 and an external base region 59. The external base region 59 is formed to have impurities of a lead electrode 57 diffused into a silicon substance. The lead electrode 57 has an insulation film 56 formed around it, the insulation film 56 having an opening and an active base region 61 being exposed. A side wall 62 is formed on a side of an opening from which the active base region 61 is exposed. The opening defined by the side wall 62 serves as a path for the impurities to be doped into an emitter. The side wall 62 is an injection hole for injecting the impurities for the emitter and serves as a mask for etching to form an introduction.

A portion at which a base contact hole 65' is positioned has insulation films 56 and 66 formed thereat. A portion at which a collector contact hole 67 is positioned also has a heat oxidized film 58 and the insulation film 66 formed thereat. A portion at which an emitter contact hole 68 of an emitter lead electrode 64 is positioned also has the insulation film 66 formed thereat.

Those contact holes 65, 67, and 68 are opened by dry etching or a similar method, and respectively have a base electrode 70, an emitter electrode 71, and a collector electrode 72 provided thereon.

Figure 6:
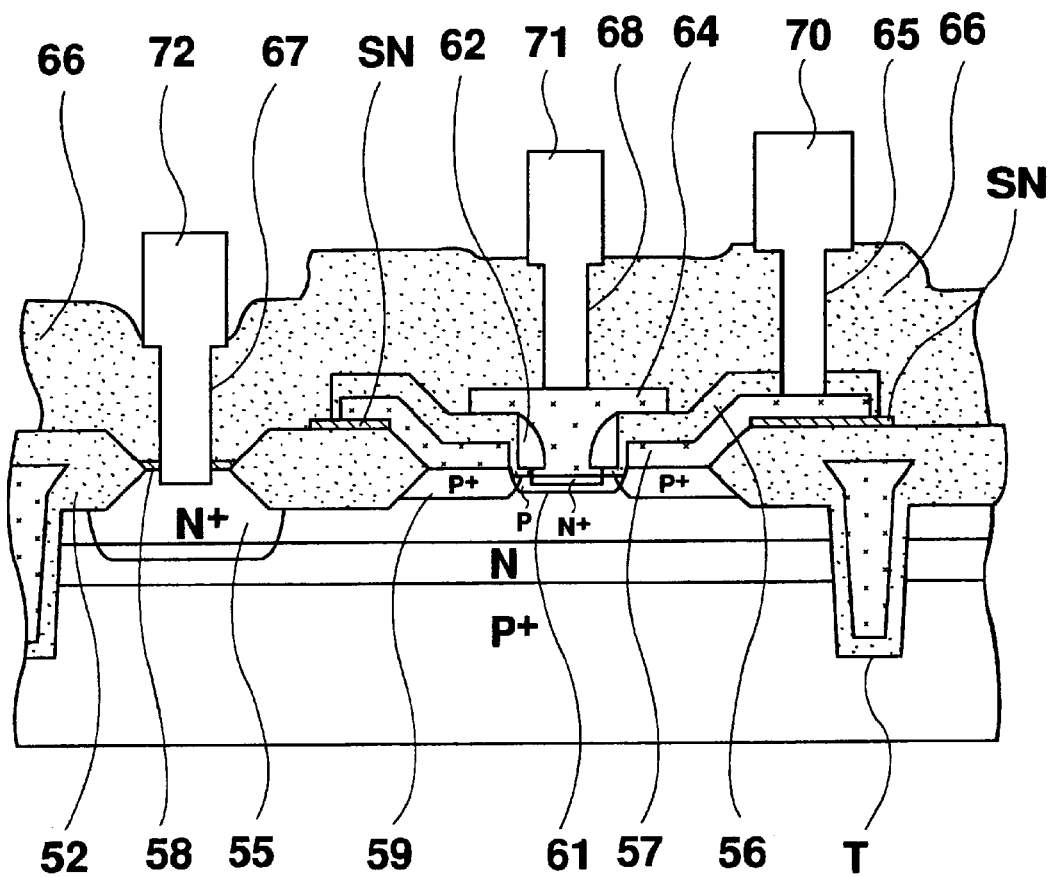
FIG. 6 is a cross-sectional view illustrating a semiconductor integration device in accordance with another embodiment of the present invention.

FIG. 6 depicts a cross-sectional view illustrating an another embodiment of the present invention. A lead electrode 64 of an emitter region, as shown in the figure, is positioned on an opening enclosed by a sidewall 62.

Figure 7:
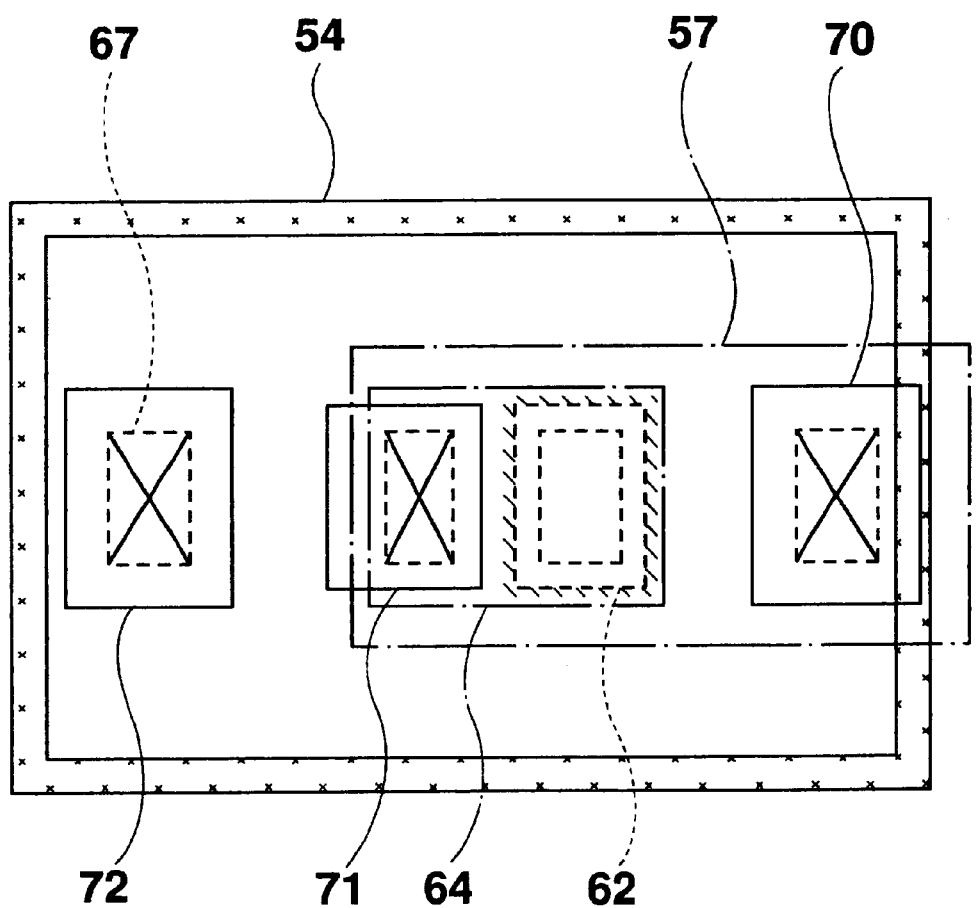
FIG. 7 is a plan view illustrating the semiconductor integration device in accordance with the embodiment of the present invention.

FIG. 7 depicts a plan view illustrating the structure of the embodiment shown in FIG. 5, particularly showing the two electrodes 57 and 64, the contact holes 65, 68, and 67, and the electrodes 70, 71, and 72.

A first feature of the present invention is the use of silicon nitride film SN as an underlying film for the lead electrode 57 of the base region. The lead electrode 57, as shown in FIG. 6, is extended and laid over the LOCOS oxide film 52. As result, the base resistance is increased. However, use of the silicon nitride film as the underlying film can restrict the increase of the base resistance.

A second feature of the present invention is that the contact hole 68 of the emitter electrode 71 is not formed just over the opening enclosed by the sidewall 62 but formed over the periphery of the opening, for example, over the LOCOS oxide film 52. The resistance is increased since the lead electrode 64 is extended to over the LOCOS.oxide film 52. However, this increase can be restricted by arranging the silicon nitride film SN as the underlying film. Effects of the underlying film will be described later.

Furthermore, as the emitter contact hole 68 is shifted, a recess of the lead electrode 64 is not formed directly over the emitter region so that the impurities can be fully doped by the lead electrode 64. This can suppress formation of a recess in the emitter region as dispersion region.

Also, another feature of the present invention is that, as shown in FIG. 5, a contact hole 77 is formed by etching the insulating film 56 and a contact hole 70 is further provided inside the contact hole 77.

Figure 4A:
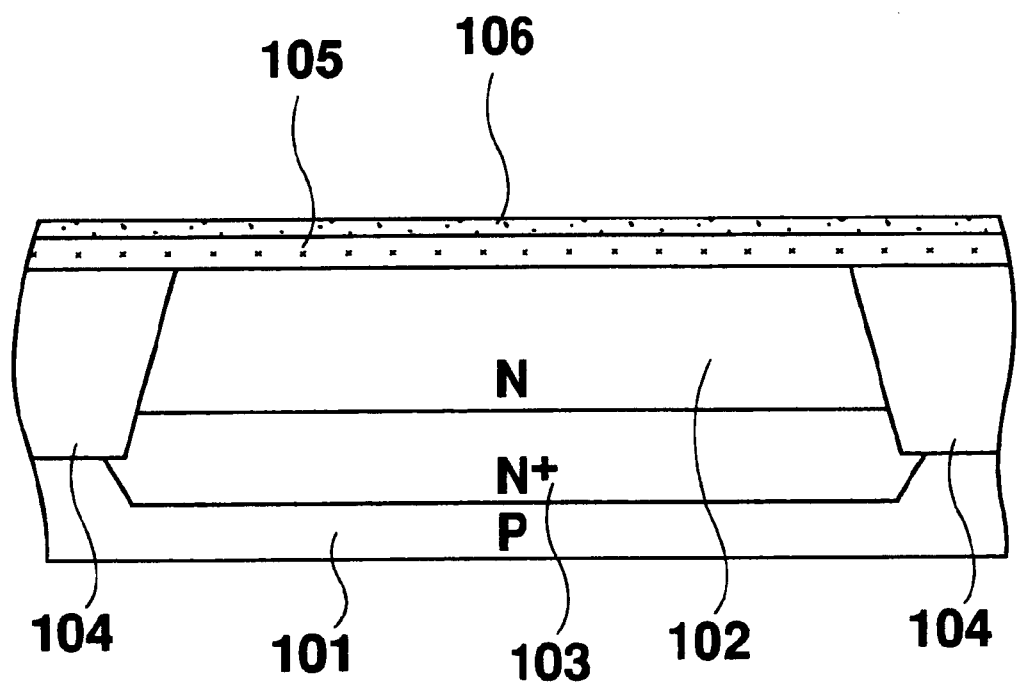
FIGS. 4A, 4B, 4C, 4D, 4E, and 4F are cross-sectional views illustrating a fabrication method of another prior semiconductor integration device.
Figure 4B:
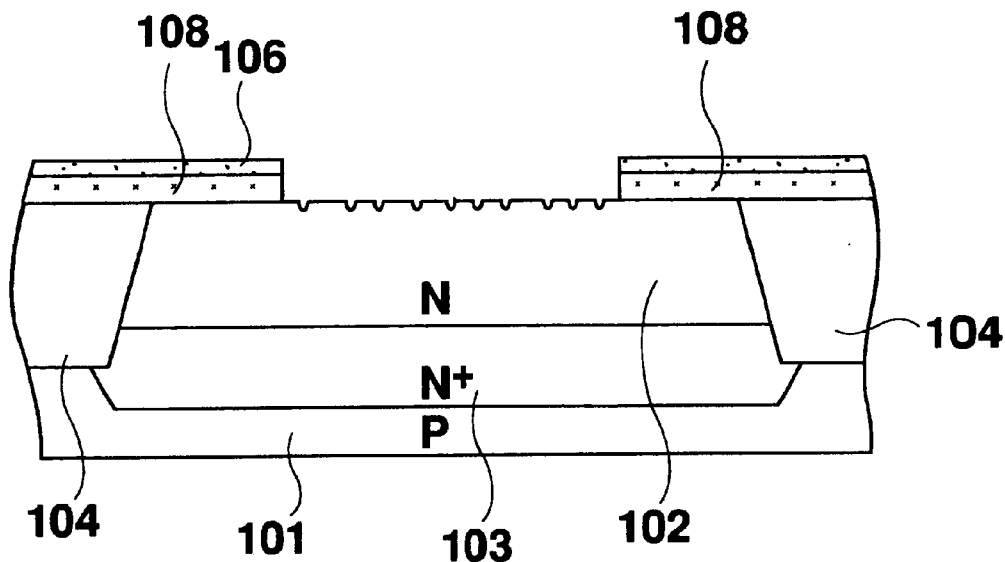
Figure 4C:
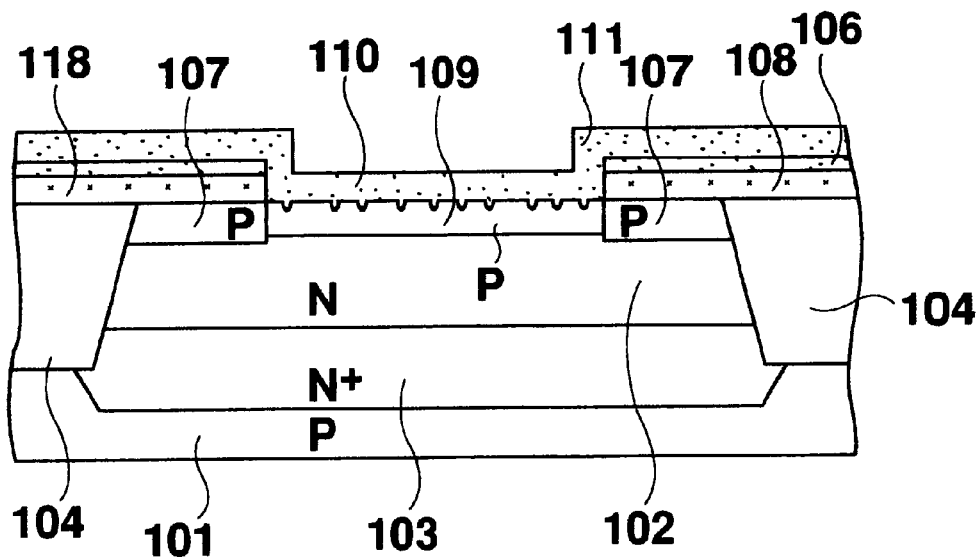
Figure 4D:
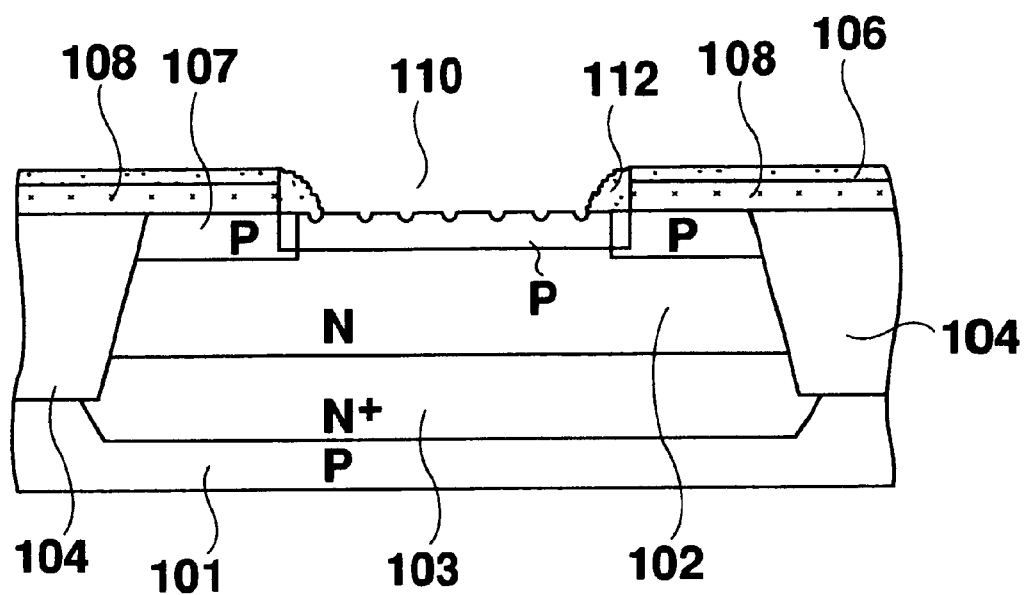
Figure 4E:
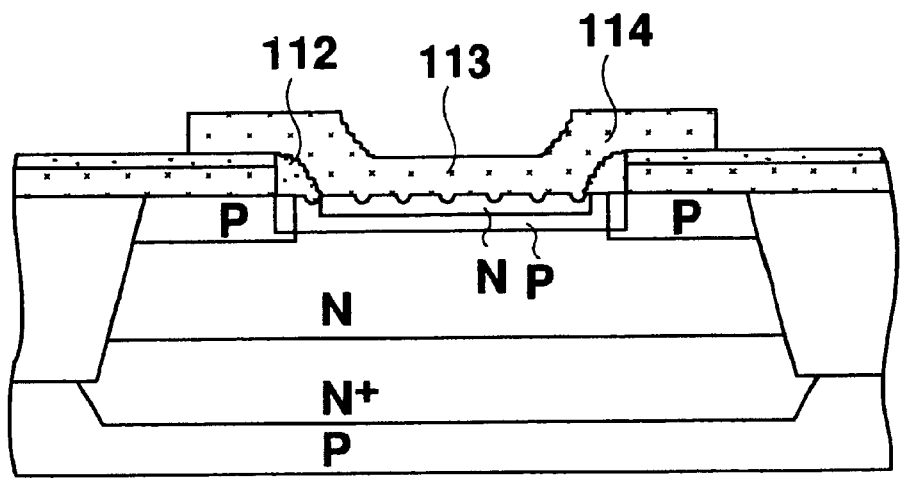
Figure 4F:
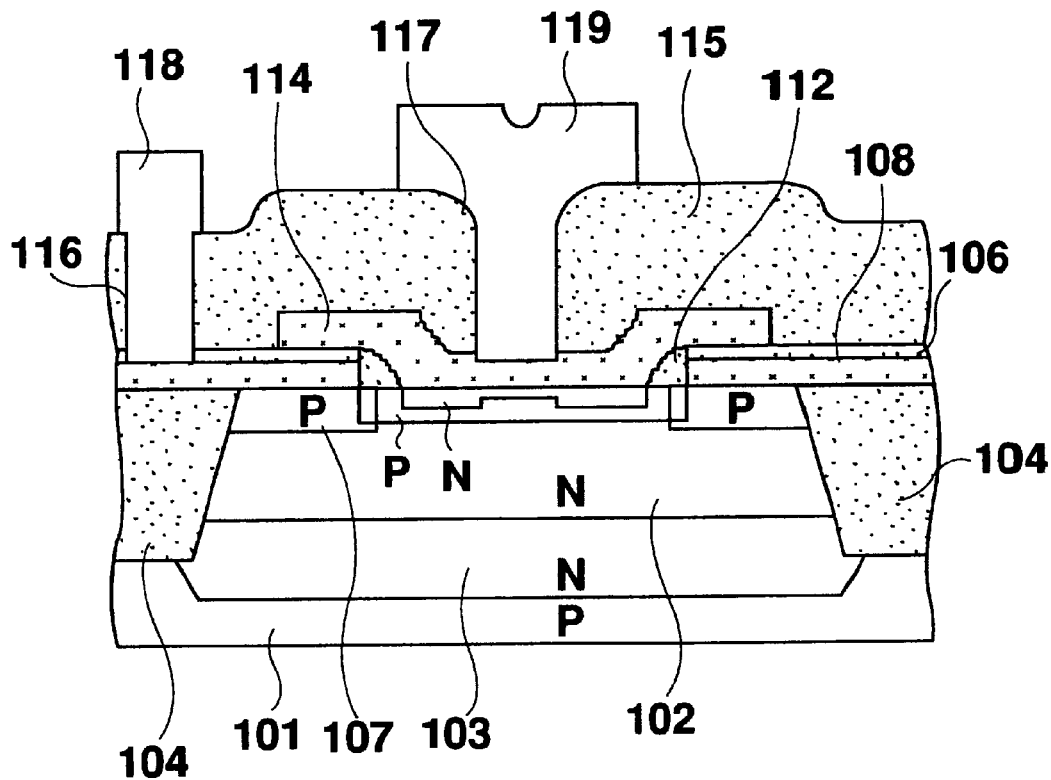

With the contact hole 77 provided, the film thickness of the insulating films at the base contact hole 70 and the emitter contact hole 71 become the same. Therefore, the lead electrode 64 in the emitter region is not unnecessarily etched. This can suppress dispersion of the diffusion depth at the emitter region as shown in FIG. 4F. Also, since the contact hole 77 is provided, the collector contact 72 is not deeply etched.

The two-layered structure is employed for the upper insulating film. The lower layer is made of non-doped silicon glass film NSG 66 and the upper layer is a silicon glass film doped with impurities. In this embodiment the upper layer is a BPSG film 79 doped with boron and phosphor. The surface of the BPSG film has a gentle slope made by heating, because of heat sag of the BPSG film 79. The NSG film is provided to prevent the impurities in the BPSG film from entering the transistor region. Thus, the BPSG film has been caused to sag by the heat treatment and a steeply opened contact is a portion of the NSG film. Also since the NSG film is provided inside the contact hole 77, the contact hole 77 can be formed without adding the film thickness of the insulating film 56 to the vertical difference.

Further, since the lead electrode 57 of the base region is made of a-Si or single crystal film, the diffusion depths in the active base region and the emitter region can be made uniform. In addition, as the exposed portion of the base contact 70 is opened not irregularly but gently or smoothly, contact characteristics with the emitter electrode can be made excellent.

The following describes in detail a method of fabrication of the present invention by reference to the accompanying drawings, FIGS. 5 and 8A, 8B, 8C, and 8D.

Figure 8A:
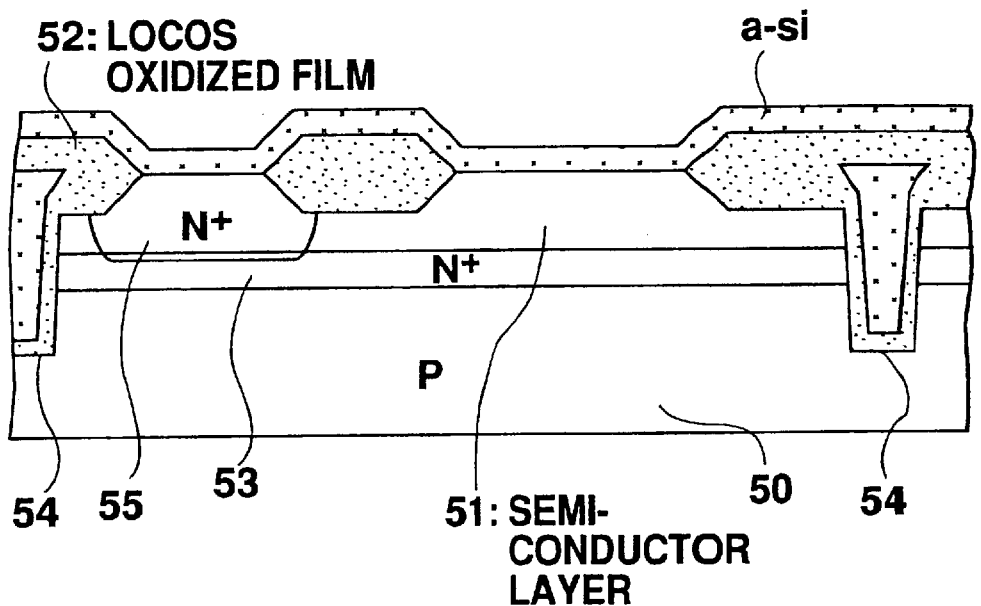
FIGS. 8A, 8B, 8C, and 8D are cross-sectional views illustrating a fabrication method of the semiconductor integration device in accordance with an embodiment of the present invention.

First, referring to FIG. 8A, epitaxial growth is carried out on a p-type semiconductor substrate 50 to form an n-type semiconductor layer 51, which becomes a collector. A surface of the semiconductor layer 51 is selectively oxidized to form the LOCOS film 52 for separating elements. The LOCOS film 52 may be alternatively made of simple thick insulation film. A buried layer 53 is of n+ type. A trench 54 is formed at a bottom of the LOCOS film 52 to electrically isolate an n-type epitaxial layer. A p+ isolation region may be formed instead.

The LOCOS film 52 encloses a region in which a transistor is formed (hereinafter referred to as the transistor formation region) and has a collector contact region 55 and a semiconductor layer 51 exposed, the semiconductor layer 51 becoming regions 59 and 61 in which a base is formed later (hereinafter referred to as the base region) (see FIG. 5). A silicon nitride film SN is formed between LOCOS layer 52 and lead electrode 57. The silicon nitride film SN functions as an under layer for the lead electrode 57. a-Si is formed to around 2000 Angstrom thick on a whole surface thereof by way of CVD and $BF_2$ ions are doped. There are various methods of ion doping into the a-Si, and one method is forming the impurities to be injected into the a-Si into a gas, which is a gas containing H and Si, for example, silane made of $H_2$ and Si. The other method is solid-diffusion, in which the film containing the impurities is formed on the a-Si film and then the impurities are diffused into the a-Si. It is preferable here to employ ion implantation that allows accurate control of resistance and concentration of an external base to make use of the a-Si as a diffusion source and also as a lead electrode.

It is important here that in adhesion of Si while forming an a-Si layer on the exposed portions of the LOCOS film 52 and the semiconductor layer 51, adhesion of polysilicon is not carried out, but adhesion of a-Si is carried out with the gas of $H_2$ and silicon by way of LPCVD or plasma CVD in a low film forming temperature. At the final step of the process, the film may be untreated a-Si or it may be heat-treated.

Figure 8B:
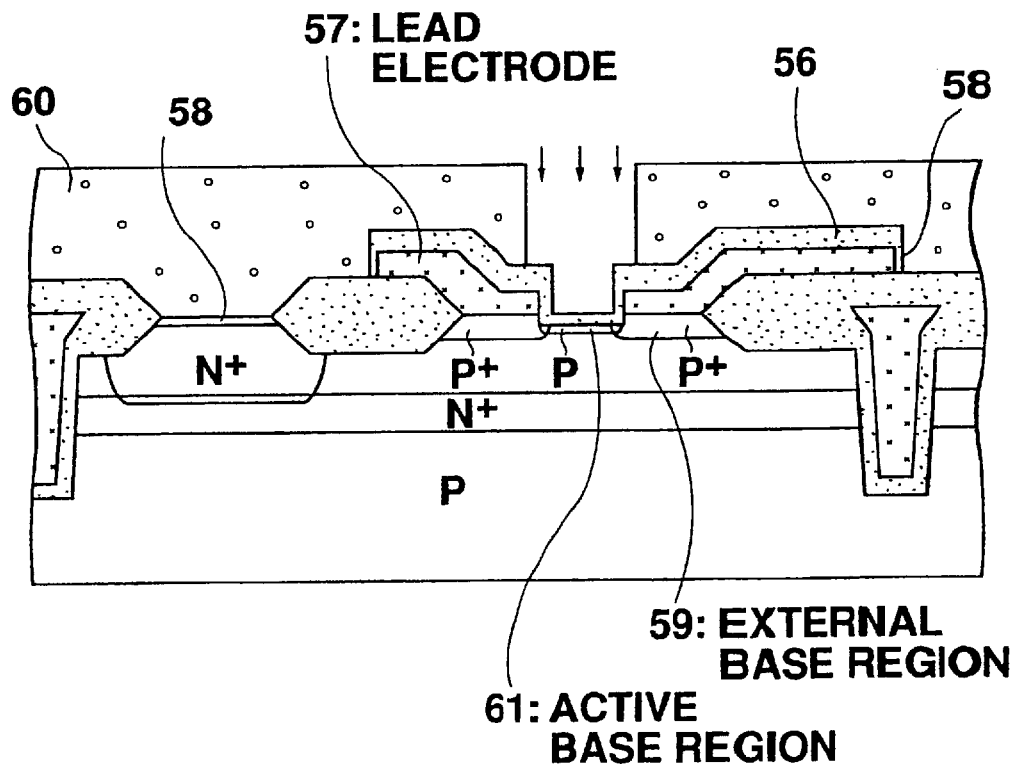

In turn, the LOCOS oxidized film 52 has the insulation film 56 formed on its entire surface. The insulation film 56 is silicon oxidized film of around 2000 Angstrom formed by way of CVD. After that, as shown in FIG. 8B, the a-Si film and the insulation film 56 undergo etching. The a-Si film constituting the future lead electrode 57 is spread on a portion corresponding to the region in which the external base region 59 is formed and on the LOCOS film 52 adjoining the region. The spread a-Si film is used as the lead electrode 57 and diffusion source by introducing impurities at a later stage. In etching, a semiconductor layer surface corresponding to a region in which the active base region is formed later undergoes light etching.

The surface of the lead electrode 57 and the region in which the active base region is formed is made smooth as they are formed of the a-Si film or film of heat-treated a-Si.

If the lead electrode 57 is formed of polysilicon, the surface of the lead electrode 57 is made uneven because of different etching speeds of the grain boundary and grain. As etching of the film corresponding to the active base region 61 comes close to the semiconductor surface, the grain boundary is clearly eliminated. However, the grain remains. As a result, the semiconductor layer positioned around the grain undergoes etching prior to the region under the remaining grain, so that the exposed semiconductor layer 51 is made uneven on the surface thereof. This increases unevenness of the surface and contact resistance at a later step of forming a diffusion region, described below.

However, the unevenness can be suppressed because of use of the a-Si film or the film of heat-treated a-Si.

In turn, the whole surface is heat-oxidized to form a heat oxidized film 58 of around 100 to 200 Angstrom on the a-Si surface and the surface of the semiconductor layer 51. In this step, the impurity in a-Si is slightly diffused into the semiconductor layer 51 to form one part of an external base region 59. Further, a resist 60 is used as a mask for ion doping and the impurities $BF_2$ for the base are doped into the semiconductor layer 51 through the heat oxidized film 58. As a result, the active base region 61 is formed at a later step of heat treatment (see FIG. 8B).

Since the unevenness of the surface of the active base region 61 is restrained, as described above, the diffusion speed at the step is made substantially uniform for all surfaces.

Figure 8C:
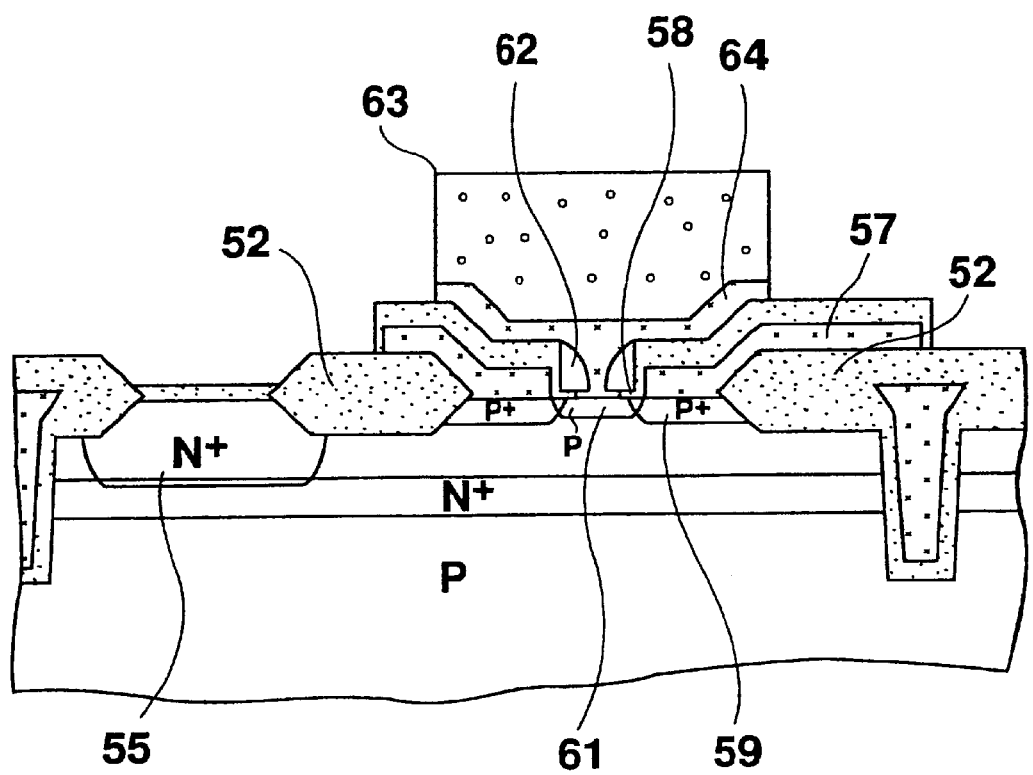

To secure insulation at each of the side walls between the lead electrode 64 of the emitter electrode, formed later as shown in FIG. 8C, and the base lead electrode 57, the whole surface is adhered with HTO (high temperature oxide) by way of LPCVD or plasma CVD. Further, after the etch-back, the surface has a side wall 62 formed on a portion corresponding to the active base region 61 (see FIG. 8C). The side wall 62 which is also made of a-Si is formed by way of an etch-back that occurs when a-Si formed on the whole surface undergoes anisotropic etching.

Although the impurities for the emitter may be ions implanted through the side wall, in this case the heat oxidized film 58 on the surface of the active base region 61 is eliminated by way of wet etching, such as solid phase diffusion, which is diffusion using the lead electrode 64.

Since the step described above forms a side wall 62 of the a-Si film or the film of heat-treated a-Si, the resulting side wall can be made even on the surface thereof. In the former ion implantation, the side wall is used as a mask. In the latter solid diffusion, the heat oxidized film 58 undergoes etching to form an impurity introduction hole. In either method, the introduction hole is affected by the shape of the side wall 62. In the present invention, however, since the side wall 62 is even on the surface thereof, the unevenness can be suppressed. In this way, it is possible to suppress dispersions of area of the emitter and diffusion depth.

Then a silicon nitride film SN is formed as an under layer for emitter lead electrode 64. Furthermore, after adhesion of the silicon film formed of the polysilicon or a-Si is carried out, in turn, the lead electrode 64 of the emitter electrode which is formed later is formed by etching the silicon film using the resist 63 as an etching mask (see FIG. 8C).

After adhesion of the silicon film, the lead electrode 64 of the emitter electrode which also serves as diffusion source, as shown in FIG. 8C, has As ions doped on the entire surface at a predetermined concentration with the resistance of the emitter electrode and impurity concentration in the emitter region taken into account. In this embodiment, as described above, the emitter contact hole 68 is shifted to the side from the top right of the opening formed by the side wall 62 (see FIG. 5). To make such a structure as in FIG. 5 possible, the lead electrode 64 is spread over the LOCOS film 52 (see FIG. 8C).

Figure 8D:
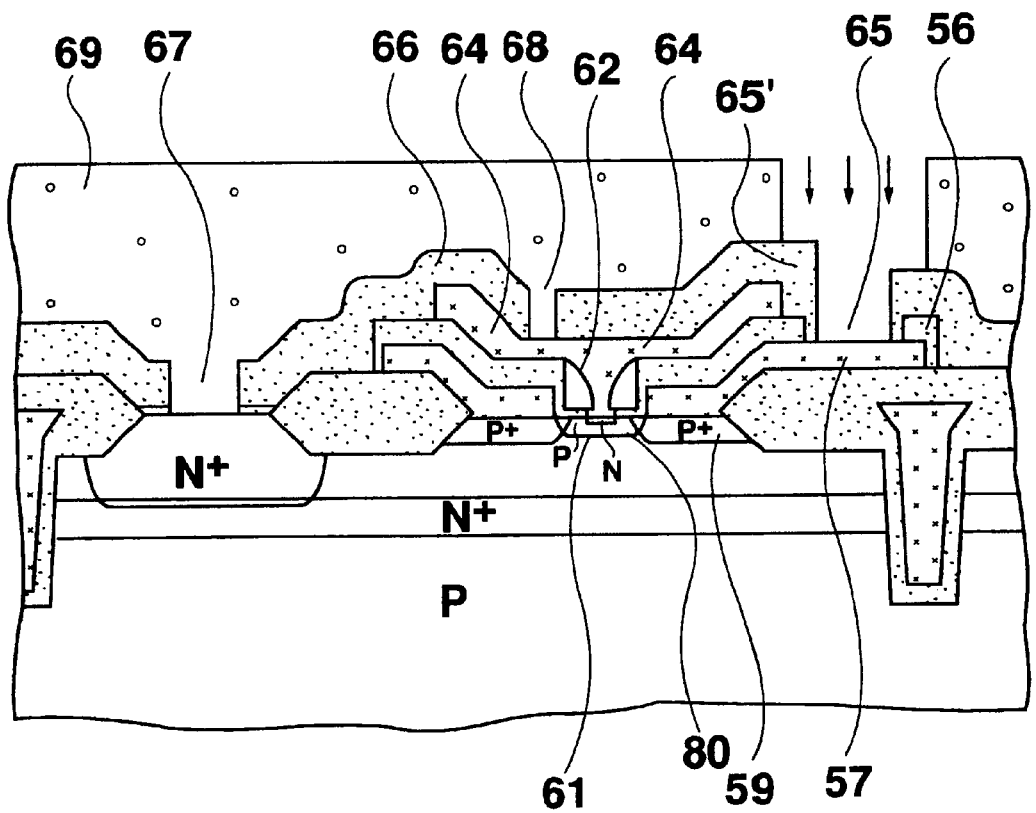

In turn, to form the base contact hole 65' for the lead electrode 57 of the base electrode, as shown in FIG. 8D, a part of the insulation film 56 undergoes etching and the insulation film 66 is formed over the entire surface. The insulation film 66 may be any of silicon oxidized film, silicon glass film, or silicon nitride film.

Further, to form the contact 65, the collector contact hole 67, and the emitter contact hole 68 for the emitter electrode, etching is carried out. After that, $BF_2$ is ion-doped into the exposed contact 65 with use of a mask 69 for ion doping. This is done to decrease the contact resistance with the lead electrode 57 of the base electrode (see FIG. 8D).

According to the embodiment, a contact hole 77 has already been formed in the insulation film 56 when the collector contact hole 67 or the emitter contact hole 68 are formed. Therefore, a recess is prevented from being formed on the lead electrode 64 or the collector region 55 when the emitter contact hole 68 or collector contact hole 67 is formed.

Figure 1A:
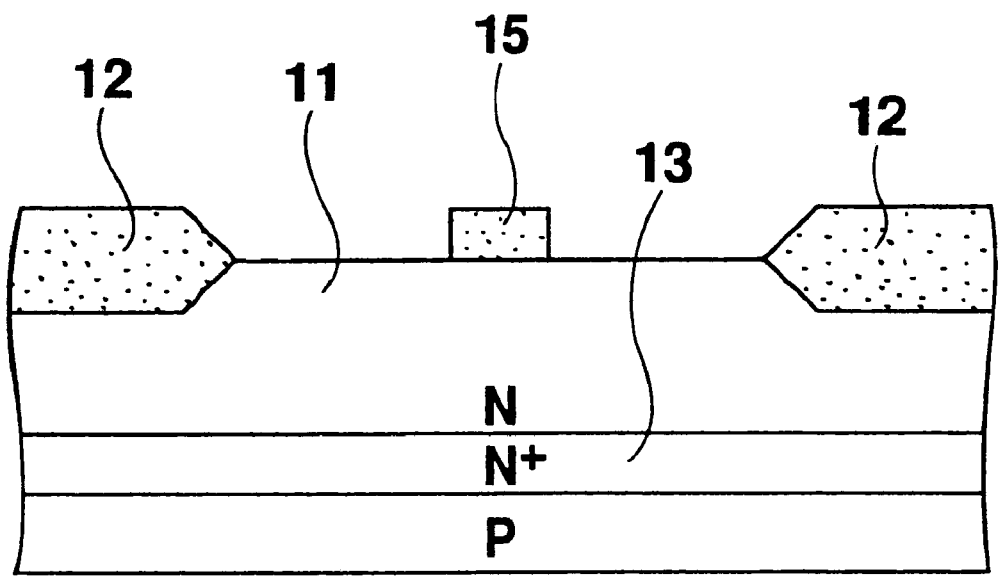
FIGS. 1A, 1B, 1C, 1D, 1E, 1F, and 1G are cross-sectional views illustrating a prior fabrication method of a semiconductor integration device.
Figure 1B:
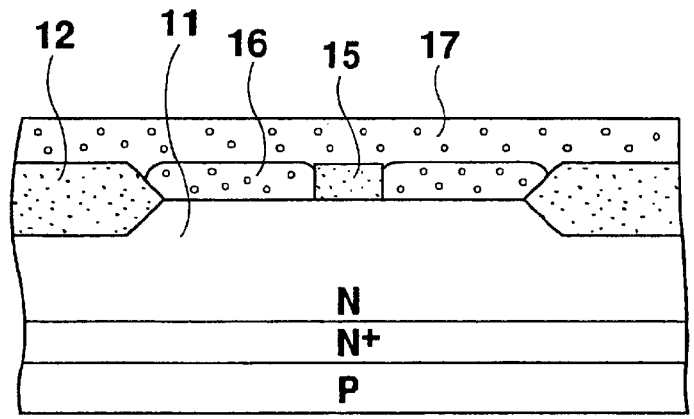
Figure 1C:
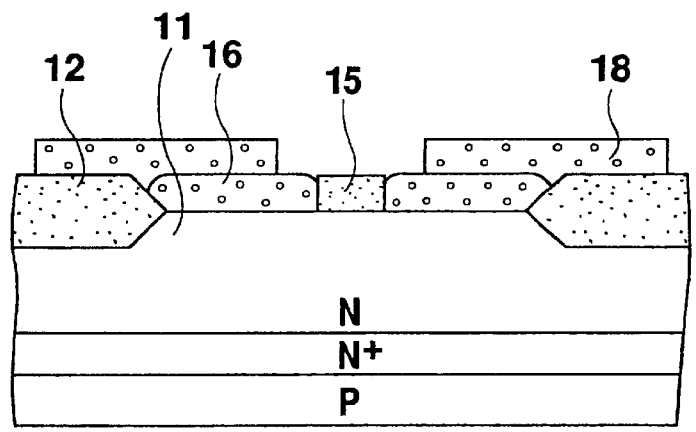
Figure 1D:
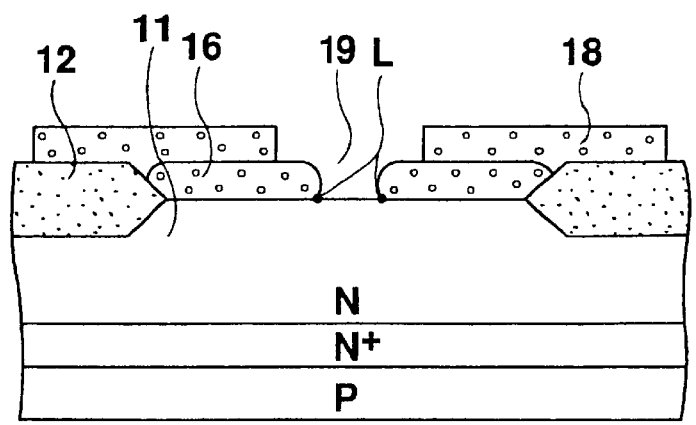
Figure 1E:
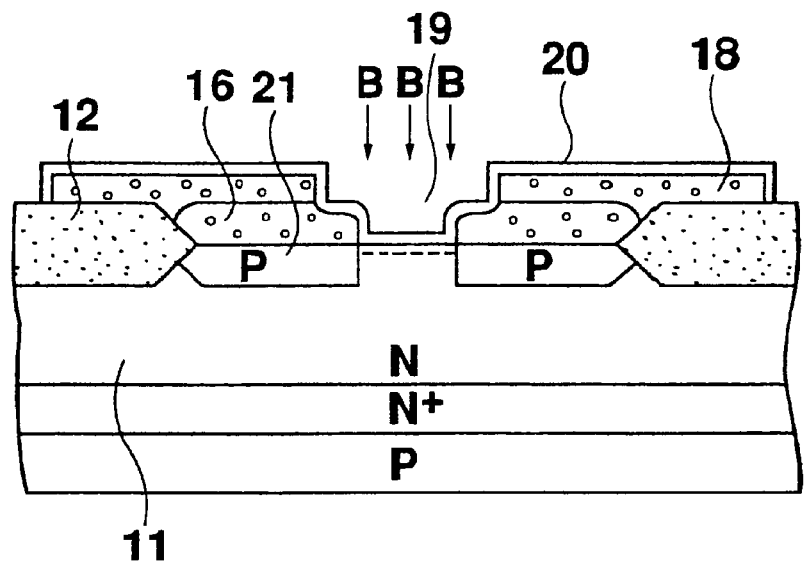
Figure 1F:
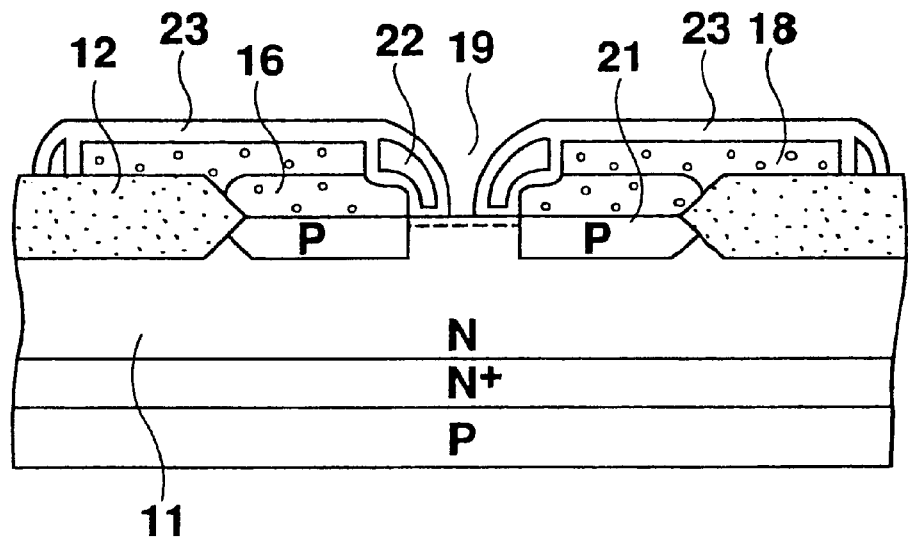
Figure 1G:
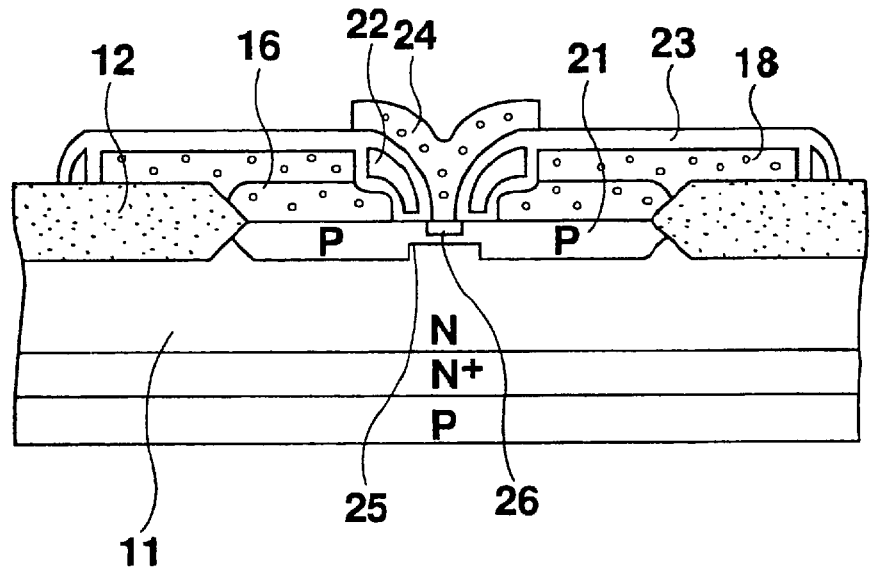
Figure 2:
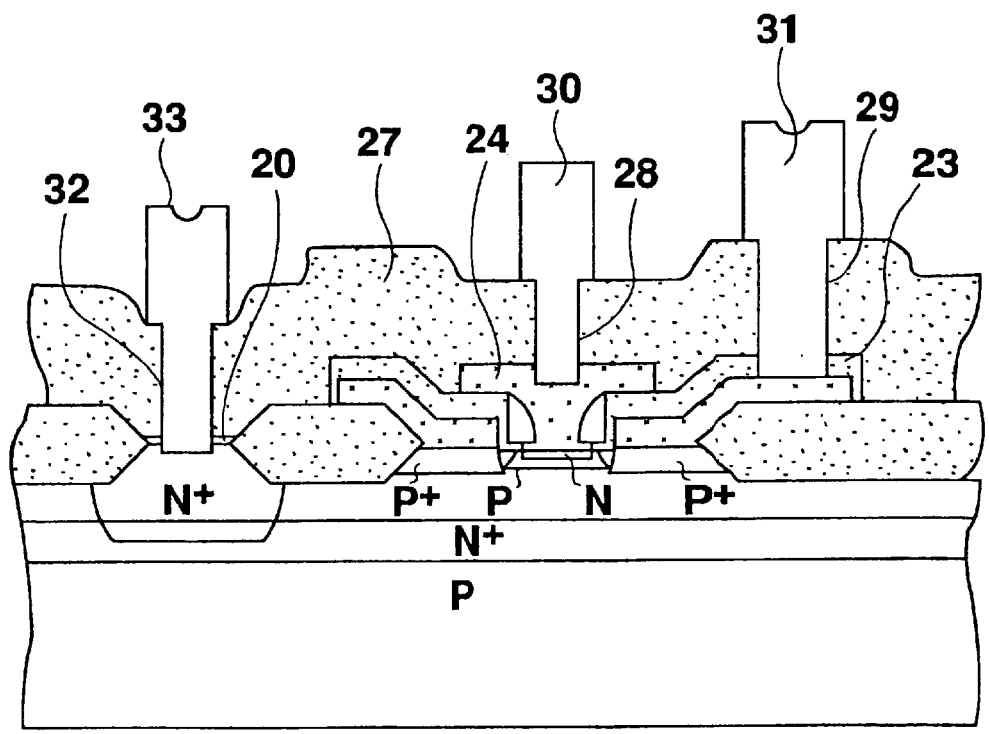
FIG. 2 is a cross-sectional view illustrating a prior structure of a semiconductor integration device.
Figure 3:
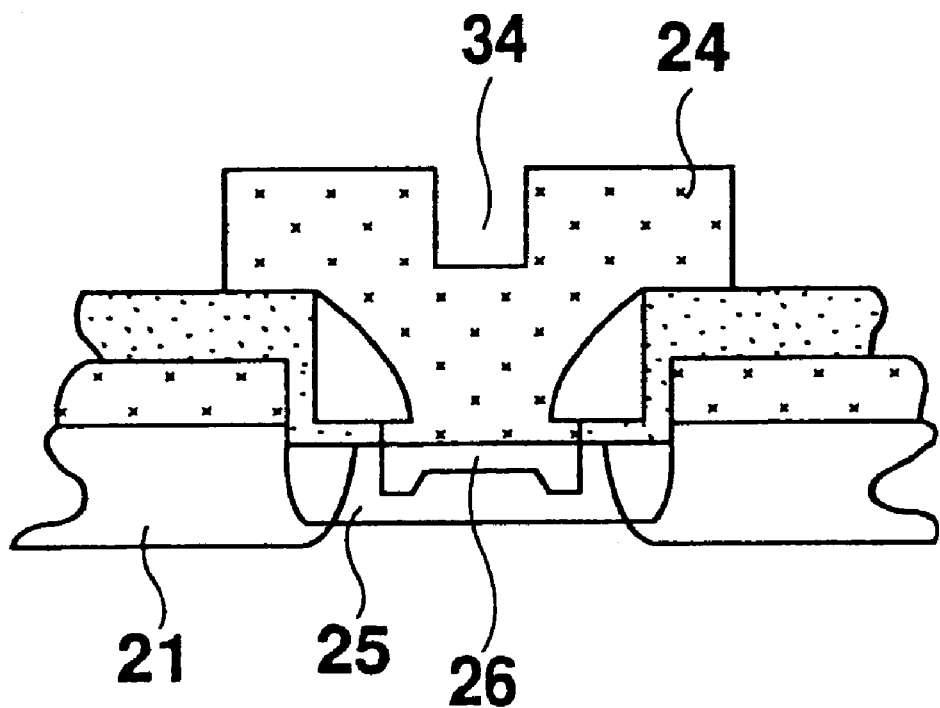
FIG. 3 is a cross-sectional view illustrating a shape of an emitter region of the semiconductor integration device shown in FIG. 2.

In that step, the insulation film 66 and the insulation film 56 may undergo etching immediately without preforming the base contact hole 65'. As the insulation film 56 and the insulation film 66 are laminated at the position at which the base contact hole 65' is formed, the total thickness of the film that will be subjected to etching is greater than the other contact. If the collector contact hole 67 is formed on the LOCOS film 52, the collector contact hole 67 becomes deeper, as the total film thickness of the insulator film on the collector increases. In either case, the lead electrode 64 corresponding to the emitter contact hole 68 undergoes excessive etching so that a recess is formed, until the collector contact hole 67 and the base contact 65 are completely formed. However, the impurities in the emitter region can be fully secured even if the lead electrode 64 undergoes excessive etching as the contact hole is formed out of the emitter region (the opening enclosing the side wall) in FIG. 8D, or on the LOCOS oxidized film 52 in FIG. 5. This means that such an uneven emitter region as in FIG. 3 can be prevented.

In turn, the resist 69 shown in FIG. 8D is removed before the whole substrate is heat-treated. As a result of the heat-treated, the ions previously doped into the lead electrode 57 are diffused into the semiconductor layer to form the external base region 59 and at the same time, the emitter region 80 is formed by way of solid phase diffusion from the emitter lead electrode 64. The diffusion depth of the emitter region 80 is around 0.5 μm and the emitter region 80 is formed further outside by the side wall 62.

After that, the base electrode 70, the emitter electrode 71, and the collector electrode 72 are formed through light etching of the contact hole.

In the embodiments described above, the lead electrode 57 in the base region and the sidewall 62 are formed by an a-Si film or a heat-treated a-Si film. Alternatively, it is effective for either of them to be made of polysilicon. Further, the underlying film is formed for both the lead electrodes 57 and 64, but may be for either one of them.

Figure 10A:
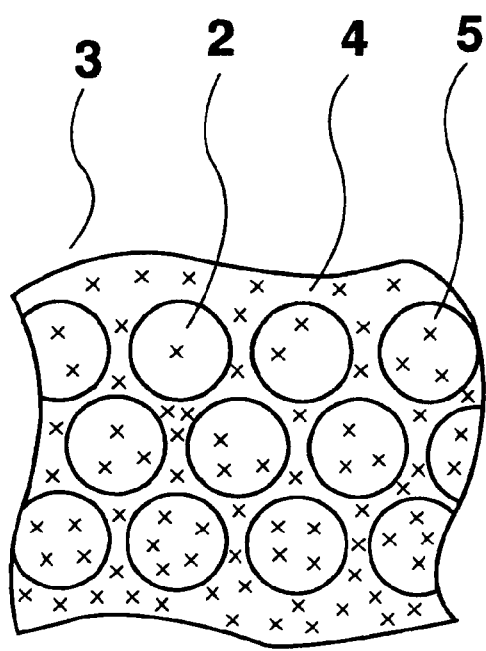
FIGS. 10A and 10B are a view illustrating states of the amorphous silicon film of the present invention and the prior polysilicon film, when ion implantation is carried out.
Figure 10B:
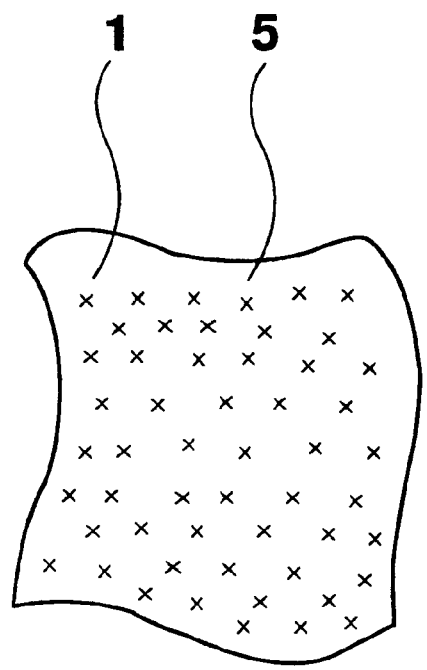

The following describes the reason why an a-Si film or a heat-treated after a-Si formed is used, and the reason why the underlying film is used. FIGS. 9A through 11B depict views illustrating transition states of films. FIGS. 9A, 10A and 11A are of the previous method in which polysilicon is directly annealed. FIGS. 9B, 10B and 11B show a transition from the amorphous silicon proposed by the present invention to the state after heat treatment. Experiments have been performed with a-Si used as resistive material because the lead electrode provides the same effect, as it is a kind of resistor.

The method of the experiment was as follows.
[I]: On a silicon substrate, silicon oxidized film of around 1000 Angstrom was grown.
[II]: The silicon substrate was inserted into the reaction chamber of an LPCVD apparatus and after that, 100% silane (SiH4) gas was supplied at 540, 580, 600, and 620° C. Film thicknesses were 2000 Å, 3000 Å, 4000 Å, respectively. (The LPCVD used in the experiment may be replaced by plasma CVD.)
[III]: $BF_2$ was ion-doped on the whole surface at 60 keV and $3 \times 10^{15}$.

[IV]: Annealing was carried out at 900° C. for one hour in a nitrogen atmosphere.
[VI]: Sheet resistance Rs was measured.

Figure 12:
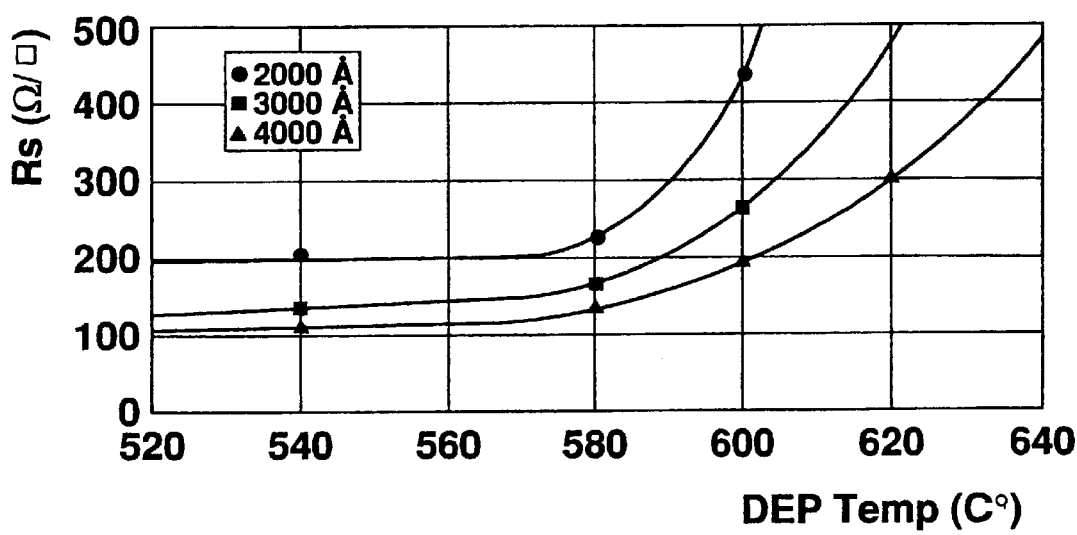
FIG. 12 is a graph for showing sheet resistance of the amorphous silicon film of the present invention and the prior polysilicon film.
Figure 13:
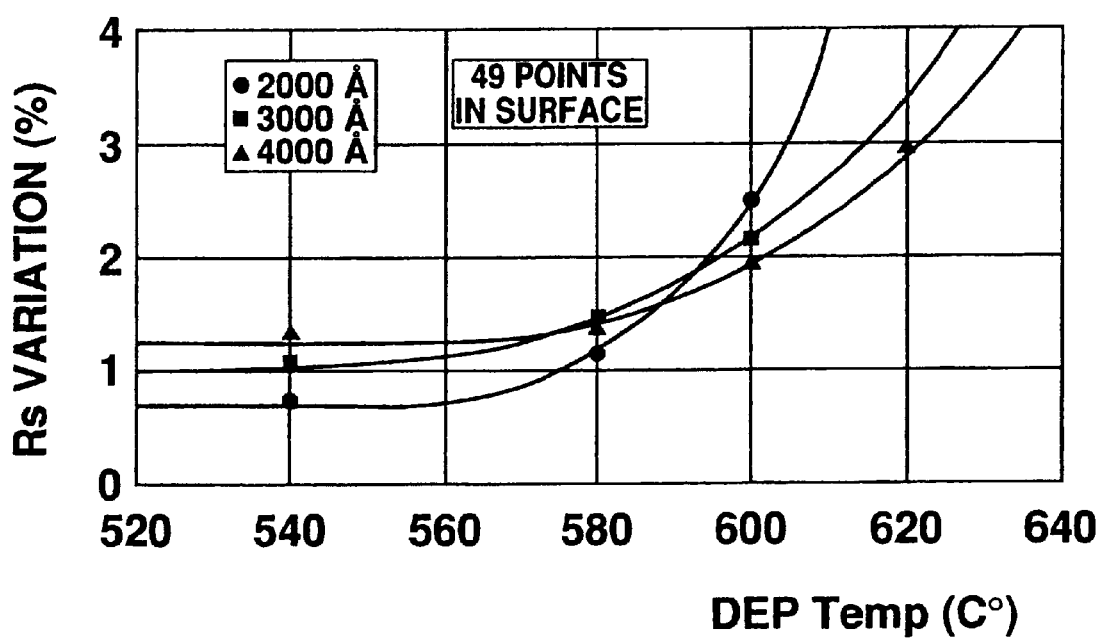
FIG. 13 is a graph for showing dispersion of the sheet resistance of the amorphous silicon film of the present invention and the prior polysilicon.

Steps [I] and [II] are shown in FIGS. 9A and 9B, the state where step [III] has been completed is shown in FIGS. 10A, 10B, the state where step [IV] has been completed is shown in FIGS. 11A, 11B, and measurement results at step [V] are shown in FIG. 12 (the sheet resistance Rs) and FIG. 13 (variation of the sheet resistance). Abscissa axes in FIGS. 12 and 13 represent film forming temperature.

Figure 14:
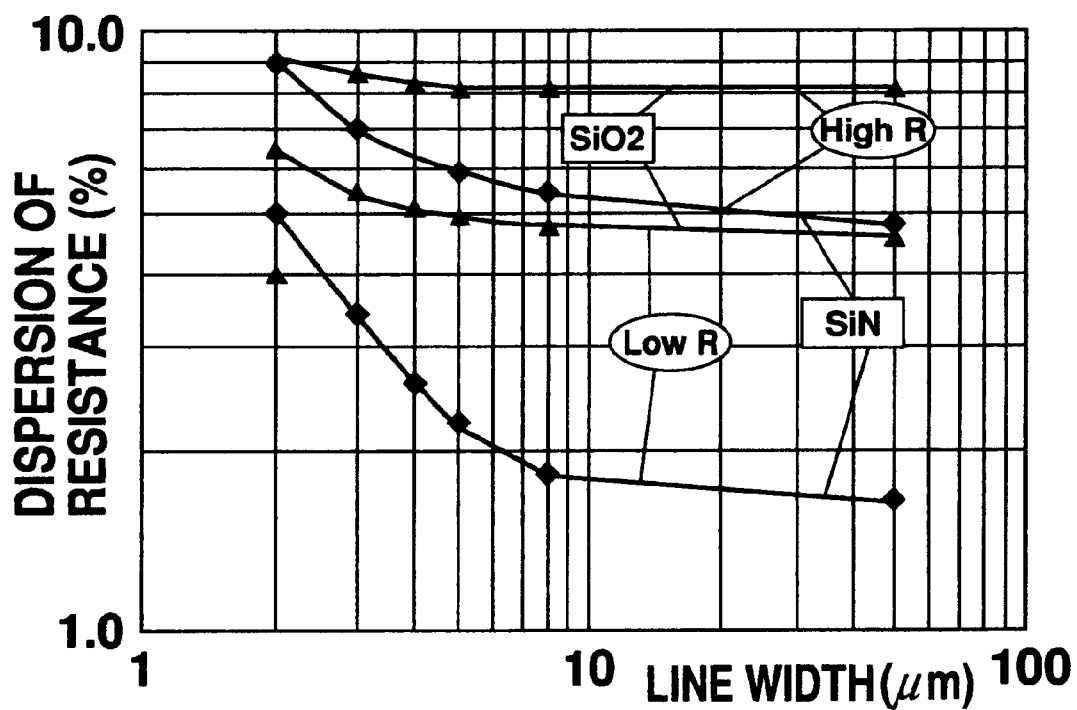
FIG. 14 is a graph for showing dispersion of resistance of resistors with underlying films being silicon oxide film and silicon nitride film.

FIG. 14 depicts a graph illustrating dispersions of resistance of the resistors after the film in FIG. 11 is subjected to patterning for use as the resistor. The number of measurements is 160. Triangle points marked on an upper line (High R) and lower line (Low R) indicate high resistance of 2 kilo ohms and low resistance of 200 ohms, respectively, with silicon oxide film as an underlying film. Rhombic points marked on an upper line and lower line respectively indicate the high resistance and low resistance mentioned above with the silicon nitride film as an underlying film.

It was found from the measurement results that the sheet resistance and variation are low as the film forming temperature is low.

It was also found that in step [II] of film forming at 520° C. to around 580° C. (hereinafter referred to as the low-temperature range) the Si film was in a state of amorphous silicon. At temperatures higher than 590° C. to 610° C. (hereinafter referred to as the high-temperature range), the surface state changed to a great extent and the Si film became polysilicon. At temperatures between around 580° C. to 600° C. (hereinafter referred to as the mid-temperature range), the surface would be in a transition region between polysilicon and amorphous silicon.

In the low-temperature range, as shown in FIG. 9B, the surface of the silicon film had little observable unevenness but formed a-Si 81 was visible under an electron microscope (×50,000). In the high-temperature range, on the other hand, as shown in FIG. 9A, the surface of the silicon film could be observed to have polysilicon film 83 of 500 Angstrom diameter with rather large grains 82. There was a grain boundary 84 between the grains 82

In turn, step [III] of ion doping has boron fluoride ($BF_2+$) 85 ion-doped, as marked by x in FIG. 10. It could be considered that impurity dispersion of the a-Si film in FIG. 10B is substantially the same as the polysilicon film in FIG. 10A. It should be noted that, if boron is ion-doped, it passes through the a-Si film and polysilicon film. Instead, boron fluoride of large size entering near their surfaces was used. Boron fluoride, etc. can be used as the ion source, because it does not enter deeply.

The annealing process at step [IV] was carried out at between 800 to 1000° C., mostly around 900° C. The results differed from expectations. In the polysilicon film 83 in FIG. 9A, the grains are grown slightly large as they are subjected to heat treatment and can be observed with an electron microscope at a magnification of 50000. However, in a-Si in FIG. 9B, it could not be determined whether grains existed or not. The a-Si was observed to be in the same state it was prior to heat-treating. Either a polysilicon film having fine grains each being a one or two digit order of Angstrom in diameter was generated, or the portion actually seen was single crystal and polysilicon film of very large grain size. Also, no grain boundary was observed. In the former case, the grain boundary would be dispersed very narrow and small. If the latter, the grain would be very large and a single one, containing substantially no grain boundary.

Roughly speaking, the Si film after annealing had grain size of around 500 Angstrom when film forming in the high-temperature rage and the surface when film forming in the low-temperature range was far smoother than the high-temperature range, although it was rough to some extent.

Therefore, when the polysilicon film in the high-temperature range was subjected to etching, as the grain boundary had a faster etching speed, the surface was rough as observed with the electron microscope. The surface of the a-Si film in the low-temperature range was almost flat.

This is because if the a-Si film is made into a further finer polycrystalline state than the polysilicon film in the high-temperature range, it is seen to be substantially flat even with the grains selectively etched, and if one or two grains form a resistor, a flat and excellently shaped pattern can be formed even with etching, as grain boundaries hardly exist compared with polysilicon. The etching employed here is anisotropic dry etching.

That is, a wafer provided in an LPCVD apparatus has a silane gas made to flow at the low-temperature range to form an a-Si film thereon and has impurities diffused while being heat-treated thereon. The film obtained can be used as a resistor and an electrode. The film, as described above, has little dispersion of sheet resistance and the surface is so even that to all intents and purposes it cannot be distinguished from that of the a-Si film. The film therefore can be etching-processed with high accuracy without irregularities on the surface even when etching to a desired shape. With these two features of little dispersion of sheet resistance and accurate shape etching, dispersion of resistance can be reduced to a great extent. Also, as the sheet resistance is decreased in the low-temperature range, as shown in FIG. 12, the film can be used as a material preferable for an electrode.

As described above, it will be understood that the a-Si film or the film having heat-treated a-Si can be etched gently or smoothly from the surface, resistance of the film formed in the low-temperature range can be decreased less than the one formed in the high-temperature range, and the resistance of the film formed in the low-temperature range can be decreased much more if the silicon nitride film is used as an underlying film.

Furthermore, as the silicon nitride film is generally excellent in terms of evenness, the film can have a polysilicon film formed thereon to decrease the resistance.

It is preferable to make the insulating film 56 as a plasma TEOS film having a thickness of around 2000-Angstrom. The plasma TEOS film is a film that is formed of an organic substance (Si(OC2H5)4) of tetraethoxysilane (TEOS) with the plasma CVD.

An important point in a fabricating process is that the insulating film should be formed at low temperature so as not to transform the a-Si film 56 to polysilicon and to keep it in the a-Si state until the completion of etching.

The insulating film 56 has to be formed at a temperature as low as possible because a-Si is transformed to polysilicon if it is heat-treated at higher temperature than around 580 degrees C.

The insulating film 56 is preferably a silicon oxide film, since a-Si is used as the lead electrode of an intended external base region and has to be insulated.

There are many ways to form the oxide film using CVD, as shown below.

| Film forming method | Reaction system | Desposition temperature |
|---|---|---|
| Normal pressure, low temperature oxidation | (SiH4—O2) | 400 degrees C. |
| Reduced pressure, low temperature oxidation | (SiH4—O2) | 400 degrees C. |
| Heat decomposition | (Si(OC2H5)4) | 750 degrees C. |
| Plasma | (SiH4—N2O) | 250 degrees C. |
| Plasma | (Si(OC2H5)4) | 400 degrees C. |
| Light | (SiH4—N2O) | 200 degrees C. |

All the above methods, except for the heat decomposition which needs the high temperature, are preferable as they are performed at relatively lower temperatures. After deposition, a-Si may be heat-treated to transform to a single crystal, as will be described later. This is because patterning can make a gentle or smooth surface of a semiconductor layer as a-Si and single crystal has no structure in which grains and grain boundaries are dotted.

What is claimed is:

1. A semiconductor integrated circuit device comprising:
    an exposed base region enclosed by a first insulating film on a semiconductor layer;
    a base region giving an active base region formed at the center region of the base region and an external base region formed to enclose the active base region;
    an emitter region formed to be enclosed in the active base region;
    a lead electrode for the external base region, being opened on the active base region and being extended from the external base region to the outside of the external base region over the first insulating film;
    a second insulating film covering the lead electrode for the external base region and being opened over the active base region;
    a sidewall formed on a side of a base opening of the second insulating film formed over the active base region;
    a lead electrode for the emitter region contacting with the emitter region through an emitter opening formed over the emitter region by the sidewall and being extended to at least the outside of the emitter opening region;
    a third insulating film formed to cover the lead electrode for the emitter region and the second insulating film;
    a base contact hole formed to expose a part of the lead electrode for the external base region;
    an emitter contact hole formed to expose a part of the lead electrode for the emitter region at the outside of the emitter opening; and
    a base electrode formed in the base contact hole, and an emitter electrode formed in the emitter contact hole, wherein:
        the second insulating film has an opening formed to enclose the base contact hole so that the base contact hole for exposing the part of the lead electrode is formed within the opening formed in the second insulating film.

2. The semiconductor integrated circuit device according to claim 1, wherein a collector region is formed in the semiconductor substrate, the first insulating film further having an opening over the collector region, a thin insulating film being formed on the collector region, over which the opening of the first insulating film is formed, the third insulating film being formed to cover the thin insulating film, a collector contact hole being formed to expose a part of the collector region, and a collector electrode being formed in the collector contact hole.

3. A semiconductor integrated circuit device comprising:

an exposed base region enclosed by a first insulating film on a semiconductor layer;

a base region giving an active base region formed at the center region of the base region and an external base region formed to enclose the active base region;

an emitter region formed to be enclosed in the active base region;

a lead electrode for the external base region, being opened on the active base region and being extended from the external base region to the outside of the external base region over the first insulating film;

a second insulating film covering the lead electrode for the external base region and being opened over the active base region;

a sidewall formed on a side of a base opening of the second insulating film formed over the active base region;

a lead electrode for the emitter region contacting with the emitter region through an emitter opening formed over the emitter region by the sidewall and being extended to at least the outside of the emitter opening region;

a third insulating film formed to cover the lead electrode for the emitter region and the second insulating film;

a base contact hole formed to expose a part of the lead electrode for the external base region;

an emitter contact hole formed to expose a part of the lead electrode for the emitter region at the outside of the emitter opening;

a base electrode formed in the base contact hole, and an emitter electrode formed in the emitter contact hole wherein;

the second insulating film has an opening formed to enclose the base contact hole; and wherein the third insulating film includes a lower non-doped silicon glass film and an upper silicon glass film having impurities doped therein, the doped including an opening formed therein.

4. A semiconductor integrated circuit device comprising:

an exposed base region enclosed by a first insulating film on a semiconductor layer;

a base region giving an active base region formed at the center region of the base region and an external base region formed to enclose the active base region;

an emitter region formed to be enclosed in the active base region;

a lead electrode for the external base region, being opened on the active base region and being extended from the external base region to the outside of the external base region over the first insulating film, wherein the lead electrode for the external base region is an amorphous silicon film or a single crystal silicon film formed by heat-treatment of amorphous silicon;

a second insulating film covering the lead electrode for the external base region and being opened over the active base region;

a sidewall formed on a side of a base opening of the second insulating film formed over the active base region;

a lead electrode for the emitter region contacting with the emitter region through an emitter opening formed over the emitter region by the sidewall and being extended to at least the outside of the emitter opening region;

a third insulating film formed to cover the lead electrode for the emitter region and the second insulating film;

a base contact hole formed to expose a part of the lead electrode for the external base region;

an emitter contact hole formed to expose a part of the lead electrode for the emitter region at the outside of the emitter opening; and a base electrode formed in the base contact hole, and an emitter electrode formed in the emitter contact hole, wherein;

the second insulating film has an opening formed to enclose the base contact hole.

5. A semiconductor integrated circuit device comprising:

an exposed base region enclosed by a first insulating film on a semiconductor layer;

a base region giving an active base region formed at the center region of the base region and an external base region formed to enclose the active base region;

an emitter region formed to be enclosed in the active base region;

a lead electrode for the external base region, being opened on the active base region and being extended from the external base region to the outside of the external base region over the first insulating film;

a second insulating film covering the lead electrode for the external base region and being opened over the active base region;

a sidewall formed on a side of a base opening of the second insulating film formed over the active base region;

a lead electrode for the emitter region contacting with the emitter region through an emitter opening formed over the emitter region by the sidewall and being extended to at least the outside of the emitter opening region;

a third insulating film formed to cover the lead electrode for the emitter region and the second insulating film;

a base contact hole formed to expose a part of the lead electrode for the external base region;

an emitter contact hole formed to expose a part of the lead electrode for the emitter region at the outside of the emitter opening;

a base electrode formed in the base contact hole, and an emitter electrode formed in the emitter contact hole;

the second insulating film has an opening formed to enclose the base contact hole; and a silicon nitride film formed between the first insulating film and the lead electrode for the external base region.

6. A semiconductor integrated circuit device comprising:

an exposed base region enclosed by a first insulating film on a semiconductor layer;

a base region giving an active base region formed at the center region of the base region and an external base region formed to enclose the active base region;

an emitter region formed to be enclosed in the active base region;

a lead electrode for the external base region, being opened on the active base region and being extended from the external base region to the outside of the external base region over the first insulating film;

a second insulating film covering the lead electrode for the external base region and being opened over the active base region;

a sidewall formed on a side of a base opening of the second insulating film formed over the active base region;

a lead electrode for the emitter region contacting with the emitter region through an emitter opening formed over the emitter region by the sidewall and being extended to at least the outside of the emitter opening region;

a third insulating film formed to cover the lead electrode for the emitter region and the second insulating film;

a base contact hole formed to expose a part of the lead electrode for the external base region;

an emitter contact hole formed to expose a part of the lead electrode for the emitter region at the outside of the emitter opening;

a base electrode formed in the base contact hole and an emitter electrode formed in the emitter contact hole;

the second insulating film has an opening formed to enclose the base contact hole; and a silicon nitride film formed between the second insulating film and the lead electrode for the emitter region.

7. A semiconductor integrated circuit device comprising:

an exposed base region enclosed by a first insulating film on a semiconductor layer;

a base region having an active base region formed at the center of the base region and an external base region formed to enclose the active base region;

an emitter region formed to be enclosed in the active base region;

a lead electrode for the external base region, being opened on the active base region and being extended from the external base region to the outside of the external base region over the first insulating film;

a second insulating film covering the lead electrode for the external base region and being opened over the active base region;

a sidewall formed on a side of a base opening of the second insulating film formed over the active base region;

a lead electrode for the emitter region contacting with the emitter region through an emitter opening formed over the emitter region by the sidewall and being extended to at least the outside of the emitter opening region;

a third insulating film formed to cover the lead electrode for the emitter region and the second insulating film;

a base contact hole formed to expose a part of the lead electrode for the external base region;

an emitter contact hole formed to expose a part of the lead electrode for the emitter region at the outside of the emitter opening; and a base electrode formed in the base contact hole, and an emitter electrode formed in the emitter contact hole, wherein:

a silicon nitride film is formed between the first insulating film and the lead electrode for the external base region.

8. The semiconductor integration device according to claim 7, further comprising:

a silicon nitride film formed between the second insulating film and the lead electrode for the emitter region.

9. The semiconductor integrated circuit device according to claim 1, wherein the third insulating film is disposed within the opening formed in the second insulating film so as to cover the opening.

* * * * *

UNITED STATES PATENT AND TRADEMARK OFFICE
CERTIFICATE OF CORRECTION

| | |
|---|---|
| PATENT NO. | : 6,114,744 |
| APPLICATION NO. | : 09/038885 |
| DATED | : September 5, 2000 |
| INVENTOR(S) | : Kawaguchi et al. |

Page 1 of 1

It is certified that error appears in the above-identified patent and that said Letters Patent is hereby corrected as shown below:

Title Page,
Item [54], Title, after "DEVICE" delete "AND FABRICATION METHOD OF THE SAME".

Title Page,
Item [56], References Cited, U.S. PATENT DOCUMENTS, after "4,762,801 08/1988 Kapoor" insert --4,812,417 03/1989 Hirao--;
after "5,955,775 9/1999 Miwa 257-587" insert --FOREIGN DOCUMENTS; 62163358 07/1987 Japan; 7-235547 09/1995 Japan; 2,576,373 08/1994 Japan--.

Column 13,
Line 42, after "doped" (second occurrence) insert --silicon glass film--.

Signed and Sealed this

Seventeenth Day of July, 2007

JON W. DUDAS
*Director of the United States Patent and Trademark Office*